(12) United States Patent
Kataoka et al.

(10) Patent No.: US 11,621,143 B2
(45) Date of Patent: Apr. 4, 2023

(54) ION MILLING APPARATUS AND METHOD OF MANUFACTURING SAMPLE

(71) Applicant: JEOL Ltd., Tokyo (JP)

(72) Inventors: Shogo Kataoka, Tokyo (JP); Tatsuro Mino, Tokyo (JP); Koji Todoroki, Tokyo (JP)

(73) Assignee: JEOL Ltd., Tokyo (JP)

( * ) Notice: Subject to any disclaimer, the term of this patent is extended or adjusted under 35 U.S.C. 154(b) by 17 days.

(21) Appl. No.: 17/378,864

(22) Filed: Jul. 19, 2021

(65) Prior Publication Data

US 2022/0020558 A1 Jan. 20, 2022

(30) Foreign Application Priority Data

Jul. 20, 2020 (JP) .............................. JP2020-123495

(51) Int. Cl.
  *H01J 37/20* (2006.01)
  *H01J 37/305* (2006.01)
  *H01J 37/09* (2006.01)

(52) U.S. Cl.
  CPC ............. *H01J 37/20* (2013.01); *H01J 37/09* (2013.01); *H01J 37/3053* (2013.01); *H01J 2237/20214* (2013.01)

(58) Field of Classification Search
  CPC .............................. H01J 37/20; H01J 37/3053
  See application file for complete search history.

(56) References Cited

U.S. PATENT DOCUMENTS

| 7,722,818 B2 | 5/2010 | Hasegawa et al. |
| 2016/0181059 A1* | 6/2016 | Vystavel ............... H01J 37/20 250/442.11 |
| 2018/0342369 A1* | 11/2018 | Kataoka ............. C23C 14/5833 |
| 2021/0287871 A1 | 9/2021 | Asai et al. |

FOREIGN PATENT DOCUMENTS

| DE | 112016007058 B4 | 2/2022 |
| JP | 2005091094 A | 4/2005 |
| KR | 101522875 B1 | 5/2015 |
| WO | 2015122713 A1 | 8/2015 |

OTHER PUBLICATIONS

Office Action issued in JP2020-123495 dated Jun. 21, 2022.
Extended European Search Report issued in EP21185017.7 dated Dec. 15, 2021.

* cited by examiner

*Primary Examiner* — Eliza W Osenbaugh-Stewart
(74) *Attorney, Agent, or Firm* — The Webb Law Firm

(57) ABSTRACT

An ion milling apparatus includes a pair of shielding members sandwiching a sample, and an ion source configured to irradiate the sample with an ion beam. The ion milling apparatus is configured to be capable of irradiating the sample with the ion beam in a first mode of irradiating the sample with the ion beam via one shielding member and in a second mode of irradiating the sample with the ion beam via the other shielding member.

10 Claims, 15 Drawing Sheets

PRIOR ART

ION MILLING APPARATUS AND METHOD OF MANUFACTURING SAMPLE

CROSS-REFERENCE TO RELATED APPLICATION

This application claims priority to Japanese Patent Application No. 2020-123495 filed Jul. 20, 2020, the disclosure of which is hereby incorporated by reference in its entirety.

BACKGROUND OF THE INVENTION

Field of the Invention

The present invention relates to an ion milling apparatus and a method of manufacturing a sample.

Description of Related Art

An ion milling apparatus is an apparatus that processes a sample by an ion beam. The ion milling apparatus is used to manufacture a sample to be observed with an electron microscope such as a scanning electron microscope and a transmission electron microscope or a sample to be analyzed with an electron probe microanalyzer, an auger microscope, or the like. In a case where the sample is processed by the ion milling apparatus, a shielding member that shields the ion beam is used, and the sample is irradiated with the ion beam through the shielding member (see, for example, JP 2005-91094 A).

The conventional ion milling apparatus includes, for example, a configuration illustrated in FIG. 23 or 24 in order to set the sample on the shielding member.

In FIG. 23, a sample 200 is attached and fixed to a sample placing stand 210. A plate-shaped shielding member 220 is arranged on the opposite side of the sample placing stand 210. The sample 200 is sandwiched and fixed between the sample placing stand 210 and the shielding member 220.

Meanwhile, in FIG. 24, the sample 200 is fixed with a clip 240. The clip 240 is supported so as to be swingable about a fulcrum portion 250. The clip 240 is biased in one direction by force F1 of a spring 260. The plate-shaped shielding member 220 is arranged on the opposite side of the clip 240. The sample 200 is fixed to the shielding member 220 by pressing force F2 applied from the clip 240 to the sample 200. The pressing force F2 is force generated by biasing the clip 240 in one direction by the force F1 of the spring 260.

The sample 200 fixed as described above is irradiated with an ion beam 230 emitted from an ion source (not illustrated) via the shielding member 220. As a result, a part 200a of the sample 200 protruding from an edge portion 220a of the shielding member 220 is removed by etching. Therefore, a cross section of the sample 200 is formed immediately below the edge portion 220a of the shielding member 220.

However, the conventional ion milling apparatus has the following problems.

In a case where the sample 200 is irradiated with the ion beam 230 via the shielding member 220 as described above, the current density of the ion beam 230 that determines a processing rate decreases as the ion beam 230 goes away from the ion source. That is, the longer a distance from the ion source is, the lower the processing rate is. The distance from the ion source increases as the ion beam 230 goes away from the shielding member 220 in the thickness direction of the sample 200, that is, as the ion beam 230 goes toward the lower parts of FIGS. 23 and 24. Therefore, when a processing rate on an upper surface side of the sample 200 close to the shielding member 220 is compared with a processing rate on a lower surface side of the sample 200 far from the shielding member 220, the processing rate is lower on the lower surface side of the sample 200 than on the upper surface side. As a result, as illustrated in FIG. 25, a cross section 200b of the sample 200 has a shape gently inclined from the upper surface side of the sample 200 toward the lower surface side thereof. In addition, the inclination of the cross section 200b of the sample 200 appears more remarkably as the thickness dimension of the sample 200 increases.

Therefore, for example, as illustrated in FIG. 26, in a case where a processing target of the sample 200 is a through-hole 300, the following problems occur even if an ion beam is emitted with the edge portion 220a of the shielding member 220 accurately aligned with the center of the through-hole 300. When the cross section of the sample 200 processed by the irradiation of the ion beam is inclined as illustrated by a wavy line in the figure, a part 300a of the through-hole 300 remains without being subjected to cross-section processing on the lower surface side of the sample 200. As a result, as illustrated in FIG. 27, the part 300a of the through-hole 300 does not appear in the cross section 200b of the sample 200 and cannot be observed. In addition, in order to eliminate the inclination of the cross section 200b of the sample 200, it is necessary to continue to irradiate the lower surface side of the sample 200 with an ion beam having a low current density, which increases processing time.

SUMMARY OF THE INVENTION

An object of the present invention is to provide an ion milling apparatus and a method of manufacturing a sample that are capable of efficiently manufacturing a sample having a cross section whose inclination is reduced.

An ion milling apparatus according to the present invention includes a pair of shielding members that sandwich a sample and an ion source that irradiates the sample with an ion beam. The ion milling apparatus is configured to be capable of irradiating the sample with the ion beam in a first mode and a second mode. The first mode is a mode of irradiating the sample with the ion beam via one shielding member of the pair of shielding members. The second mode is a mode of irradiating the sample with the ion beam via the other shielding member.

A method of manufacturing a sample according to the present invention includes a first processing step of sandwiching a sample between a pair of shielding members and irradiating the sample with an ion beam via one of the shielding members and a second processing step of irradiating the sample with the ion beam via the other shielding member.

According to the present invention, it is possible to efficiently manufacture a sample having a cross section whose inclination is reduced.

DESCRIPTION OF THE INVENTION

Figure 1:
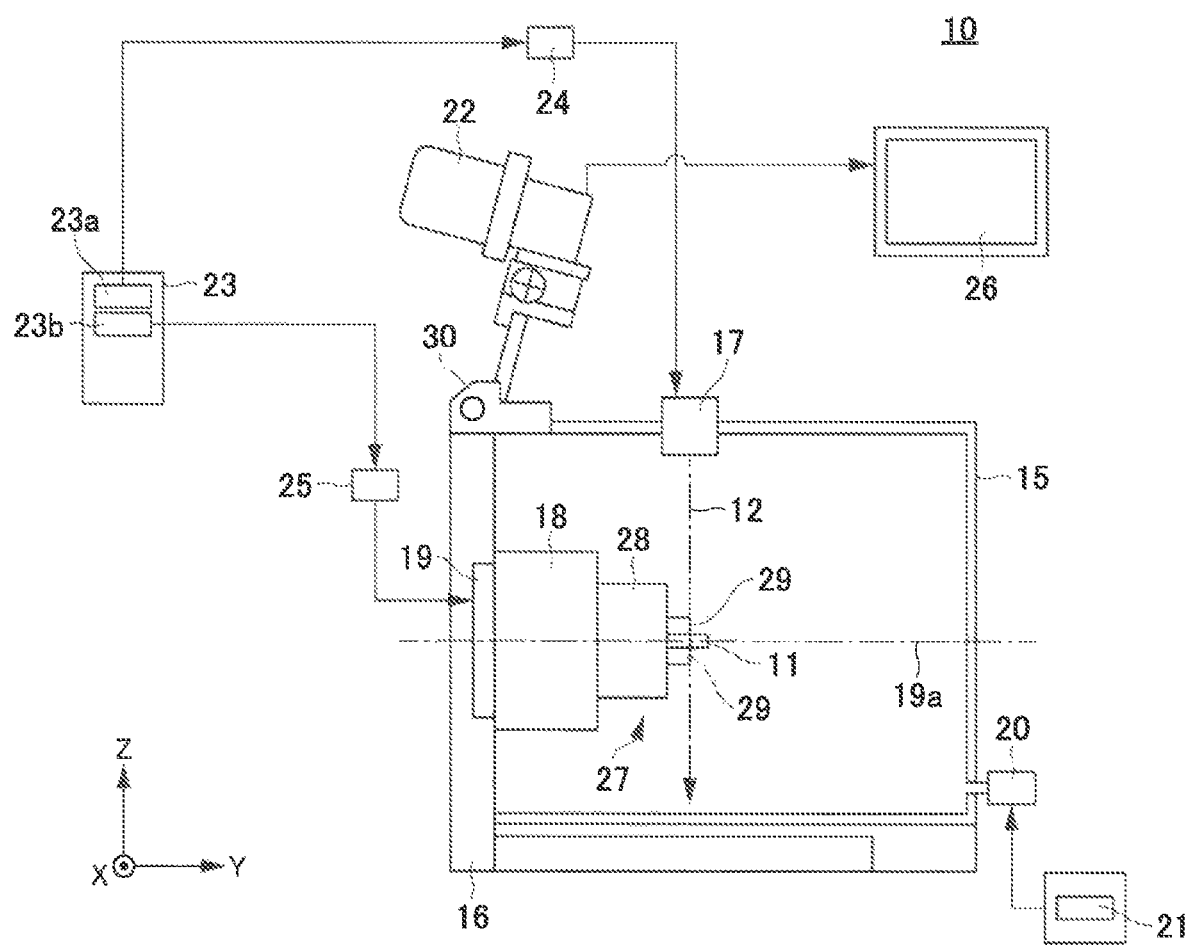
FIG. 1 is a schematic diagram illustrating a configuration example of an ion milling apparatus according to a first embodiment of the present invention.

Hereinafter, embodiments of the present invention will be described in detail with reference to the drawings. In the present specification and the drawings, elements having substantially the same function or configuration will be denoted by the same reference numerals, and redundant description will be omitted.

First Embodiment

Configuration of Ion Milling Apparatus 10

FIG. 1 is a schematic diagram illustrating a configuration example of an ion milling apparatus 10 according to a first embodiment of the present invention.

The ion milling apparatus 10 illustrated in FIG. 1 is used, for example, for manufacturing a sample to be observed with a scanning electron microscope or a transmission electron microscope, or for manufacturing a sample to be analyzed with an electron probe microanalyzer, an auger microscope, or the like. The ion milling apparatus 10 is an apparatus that irradiates a sample 11 that is an object to be processed with an ion beam 12 to process the sample 11 into a shape suitable for observation with a scanning electron microscope or a transmission electron microscope. The sample 11 is formed in a flat plate shape.

As illustrated in FIG. 1, the ion milling apparatus 10 includes a vacuum chamber 15, a sample stage pull-out mechanism 16, an ion source 17, a sample stage 18, a rotation mechanism 19, an evacuation unit 20, an evacuation control unit 21, a camera 22, a control unit 23, a voltage power supply 24, a rotation drive unit 25, and a display unit 26. The control unit 23 includes an ion source control unit 23a and a rotation control unit 23b.

The vacuum chamber 15 is a hollow chamber. The evacuation unit 20 is connected to the vacuum chamber 15. Driving of the evacuation unit 20 is controlled by the evacuation control unit 21. The evacuation unit 20 is driven under the control of the evacuation control unit 21 to discharge air in the vacuum chamber 15.

The sample stage pull-out mechanism 16 is a mechanism for pulling out the sample stage 18 from the vacuum chamber 15. The sample stage pull-out mechanism 16 is attached to the vacuum chamber 15 so that the sample stage pull-out mechanism 16 is openable and closable so as to close an opening of the vacuum chamber 15. The sample stage 18 and the rotation mechanism 19 are attached to the sample stage pull-out mechanism 16.

In a state in which the sample stage pull-out mechanism 16 closed, the sample stage 18 is accommodated in the vacuum chamber 15. In addition, in a state in which the sample stage pull-out mechanism 16 is opened, the rotation mechanism 19 is arranged while being pulled out to the outside of the vacuum chamber 15. The open and close states of the sample stage pull-out mechanism 16 are switchable by moving the sample stage pull-out mechanism 16 with respect to the vacuum chamber 15 in a left-right direction in FIG. 1. The sample stage 18 is a stage that supports the sample 11 via the sample holder 27. The sample holder 27 is a holder that supports the sample 11. The sample holder 27 includes a holder body 28 that serve as a base and a shielding member 29. The sample holder 27 is attachable and detachable to and from the sample stage 18. The shielding member 29 is a member that shields the sample 11. The shielding member 29 is formed in a plate shape.

The rotation mechanism 19 is a mechanism that rotates the sample holder 27 via the sample stage 18. A rotation axis 19a of the rotation mechanism 19 is arranged in a direction orthogonal to a central axis 32 of the ion beam 12 and parallel to a direction (Y direction in the figures) in which the sample 11 protrudes from the shielding member 29. The rotation mechanism 19 rotates the sample holder 27 according to the driving of the rotation drive unit 25. At this time, the sample holder 27 rotates about the rotation axis 19a of the rotation mechanism 19. The rotation control unit 23b controls the rotation of the sample holder 27 via the rotation drive unit 25. The rotation mechanism 19 may be a mechanism that rotates the sample holder 27 integrally with the sample stage 18, or may be a mechanism that rotates the sample holder 27 separately from the sample stage 18.

The ion source 17 is arranged in an upper portion of the vacuum chamber 15, that is, in a ceiling portion. The ion source 17 is a portion that emits the ion beam 12. The ion source 17 includes, for example, a gas ion gun. The gas ion gun is an ion gun that emits an ion beam by ionizing argon gas by discharge. The ion source 17 emits the ion beam 12 vertically downward toward the internal space of the vacuum chamber 15.

In the following description, one direction of biaxial directions orthogonal to the central axis 32 of the ion beam 12 is defined as an X direction and the other direction is defined as a Y direction. In addition, a direction parallel to the central axis 32 of the ion beam 12 and orthogonal to the X direction and the Y direction is defined as a Z direction. In the first embodiment of the present invention, the X direction and the Y direction are horizontal biaxial directions, and the Z direction is a vertical direction (up-down direction). In addition, the central axis 32 of the ion beam 12 is an axis parallel to the vertical direction.

The voltage power supply 24 is electrically connected to the ion source 17. The voltage power supply 24 is a power supply that applies a voltage to the ion source 17. The voltage power supply 24 applies a voltage to the ion source 17 under the control of the ion source control unit 23a, whereby the ion beam 12 is emitted from the ion source 17. The ion source control unit 23a controls the ion source 17 via the voltage power supply 24.

The camera 22 is provided so as to be rotatable by a camera rotation mechanism 30. The camera rotation mechanism 30 is attached to an upper portion of the sample stage pull-out mechanism 16 and moves integrally with the sample stage pull-out mechanism 16. The camera 22 can be arranged at a first position and a second position by the rotation of the camera rotation mechanism 30. The first position is a position where an optical axis of the camera 22 is arranged parallel to the Z direction. When the camera 22 is arranged at the first position, the optical axis of the camera 22 is arranged so as to pass through a processing position of the sample 11. As illustrated in FIG. 1, the second position is a position where the camera 22 is arranged to be greatly inclined with respect to the Z direction.

The camera 22 photographs the sample 11 supported by the sample holder 27 and the shielding member 29. For this photographing, an optical microscope may be used instead of the camera 22. The display unit 26 displays an image captured by the camera 22. The display unit 26 includes a monitor (display) or a touch panel.

Figure 2:
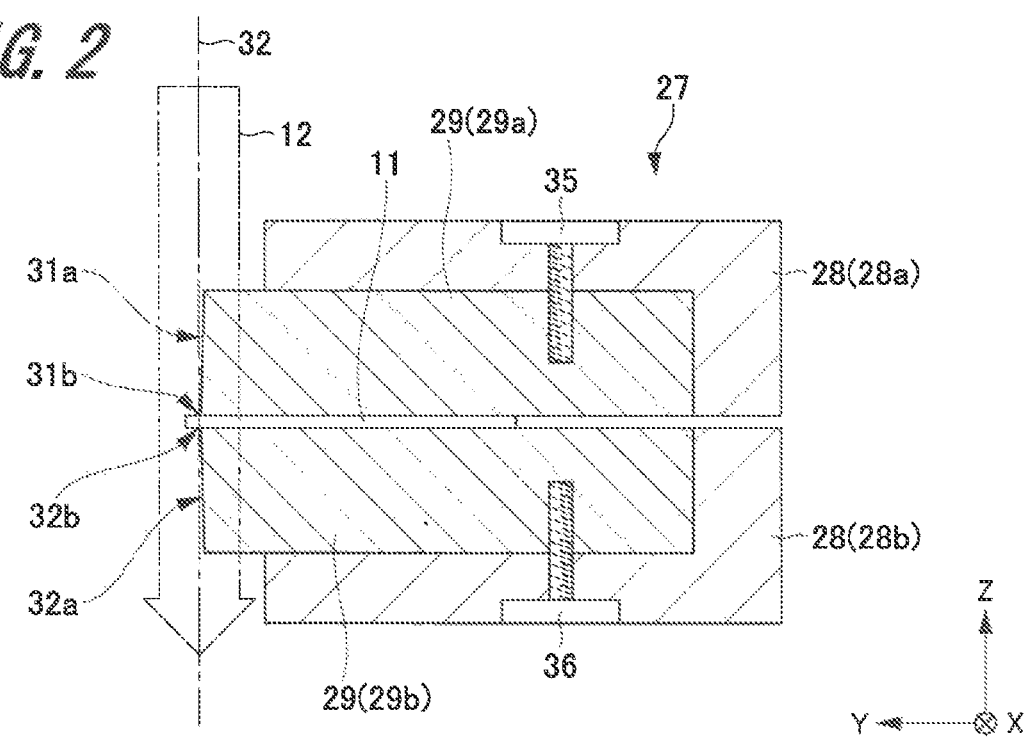
FIG. 2 is an enlarged diagram of a main part of the ion milling apparatus according to the first embodiment of the present invention.

FIG. 2 is an enlarged diagram of a main part of the ion milling apparatus 10 according to the first embodiment of the present invention. As illustrated in FIG. 2, the sample holder 27 includes a pair of shielding members 29 (29a and 29b) sandwiching the sample 11. The reason why the sample holder 27 is provided with the pair of shielding members 29 is to enable the sample 11 to be processed from either an upper side or a lower side. The ion milling apparatus 10 according to the first embodiment of the present invention has a configuration in which an orientation of the sample holder 27 supporting the sample 11 can be vertically inverted, or a configuration in which the attachment position of the ion source 17 in the vacuum chamber 15 can be vertically inverted. In the following description, the shielding member 29 arranged on the upper side in FIG. 2 is referred to as a first shielding member 29a, and the shielding member 29 arranged on the lower side is referred to as a second shielding member 29b.

A distal end surface 31a of the first shielding member 29a is slightly inclined with respect to the central axis 32 of the ion beam 12, and the distal end surface 32a of the second shielding member 29b is also slightly inclined with respect to the central axis 32 of the ion beam 12. The inclination of the distal end surface 31a is to enable an edge portion 31b of the first shielding member 29a and a protruding amount of the sample 11 from the edge portion 31b to be observed by the camera 22. Similarly, the inclination of the distal end surface 32a is to enable an edge portion 32b of the second shielding member 29b and a protruding amount of the sample 11 from the edge portion 32b to be observed by the camera 22.

The first shielding member 29a is fixed to a first holder body 28a by a screw 35. The second shielding member 29b is fixed to the second holder body 28b by a screw 36. The holder body 28 includes the first holder body 28a and the second holder body 28b. The rear end portion of each of the first holder body 28a and the second holder body 28b can be mounted on the sample stage 18 from either an up or down direction by, for example, a dovetail groove type coupling structure.

Note that a means for fixing the first shielding member 29a to the first holder body 28a is not limited to the screw 35 described above. For example, a magnet may be used, or a plate spring, a pin, or the like may be used. In a case where the first shielding member 29a is fixed to the first holder body 28a with a magnet, one of the first holder body 28a and the first shielding member 29a includes a magnetic material, the magnet is embedded in the other, and the first shielding member 29a is fixed to the first holder body 28a by magnetic attraction force generated between the magnetic material and the magnet. In addition, in a case where a leaf spring, a pin, or the like is used, the first holder body 28a and the first shielding member 29a are sandwiched by the leaf spring, the pin, or the like, whereby the first shielding member 29a is fixed to the first holder body 28a. The points described above similarly apply to a means for fixing the second shielding member 29b to the second holder body 28b.

Subsequently, procedures in the case of processing the sample using the ion milling apparatus 10 according to the first embodiment of the present invention will be described. The procedures to be described below include a method of manufacturing a sample.

Figure 3:
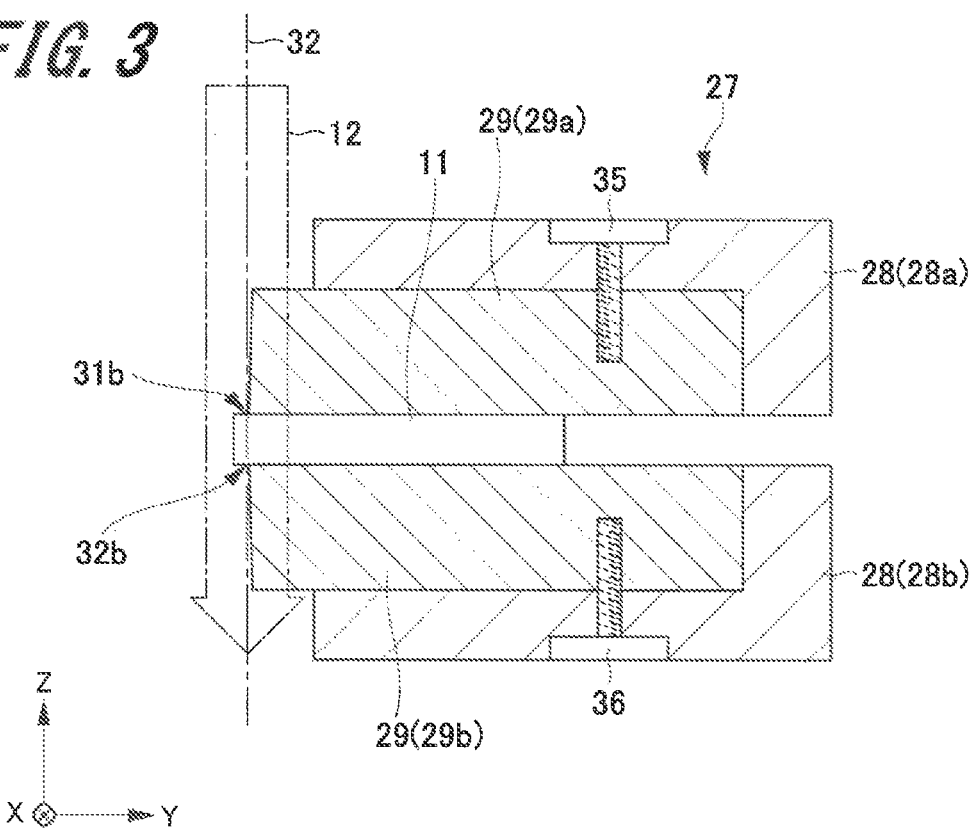
FIG. 3 is a diagram (part 1) for describing a procedure in the case of processing a sample using the ion milling apparatus according to the first embodiment of the present invention.

First, as illustrated in FIG. 3, the sample 11 is set in the sample holder 27. In the first embodiment of the present invention, the sample 11 is sandwiched by the pair of shielding members 29 (29a and 29b) included in the sample holder 27, whereby the sample 11 is supported. At this time, the sample 11 is sandwiched by the pair of shielding members 29 so that the edge portion 31b of the first shielding member 29a and the edge portion 32b of the second shielding member 29b are at the same position in the Y direction, that is, flush with each other. The sample 11 is arranged to protrude from each of the edge portions 31b of the first shielding member 29a and the edge portion 32b of the second shielding member 29b by a predetermined amount. The protruding amount of the sample 11 is defined on the basis of each of the edge portions 31b of the first shielding member 29a and the edge portion 32b of the second shielding member 29b. Although the protruding amount of the sample 11 depends on the position of a processing target, the protruding amount of the sample 11 is often set within a range of 50 μm or more and 100 μm or less.

After the sample 11 is set in the sample holder 27 as described above, the sample holder 27 is mounted on the sample stage 18. The sample holder 27 is mounted with the sample stage 18 pulled out to the outside of the vacuum chamber 15 by the sample stage pull-out mechanism 16. At this time, the sample holder 27 is mounted on the sample stage 18 with the first shielding member 29a on the upper side and the second shielding member 29b on the lower side. In addition, the protruding amount of the sample 11 is confirmed using a photographed image of the camera 22. In a case where the protruding amount of the sample 11 is confirmed, the camera 22 is arranged at the first position by the rotation of the camera rotation mechanism 30, and in this state, the photographed image of the camera 22 is displayed on the display unit 26. As a result, an operator of the ion milling apparatus 10 can confirm the protruding amount of the sample 11 using the photographed image of the camera 22 displayed on the display unit 26.

Figure 4:
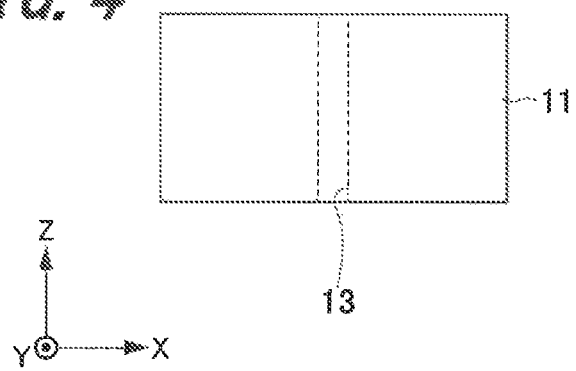
FIG. 4 is a diagram (part 1) illustrating a state of the sample processed with the ion milling apparatus according to the first embodiment of the present invention.

Next, after the camera 22 is arranged at the second position by the rotation of the camera rotation mechanism 30, the sample stage 18 is pushed into the vacuum chamber 15 by the sample stage pull-out mechanism 16, whereby the sample stage 18 is accommodated in the vacuum chamber 15. At this time, the sample holder 27 and the sample 11 are accommodated in the vacuum chamber 15 together with the sample stage 18. At this stage, as illustrated in FIG. 4, a through-hole 13 formed in the sample 11 is not exposed to the outside. The through-hole 13 serves as a target when the sample 11 after processing by the ion milling apparatus 10 is observed with an electron microscope. Therefore, the ion milling apparatus 10 needs to process the sample 11 so that the through-hole 13 of the sample 11 is set as the processing target and the entire through-hole 13 is exposed to the outside.

In the first embodiment of the present invention, the sample 11 is processed by a first processing step and a second processing step. The first processing step is a step of processing the sample 11 in a first mode of irradiating the sample 11 with the ion beam 12 via the first shielding member 29a. The second processing step is a step of processing the sample 11 in a second mode of irradiating the sample 11 with the ion beam 12 via the second shielding member 29b. In both the first processing step and the second processing step, the evacuation unit 20 evacuates the air in the vacuum chamber 15 according to a control command from the evacuation control unit 21, whereby the sample 11 is processed in a state in which the inside of the vacuum chamber 15 is maintained at a predetermined degree of vacuum.

First Processing Step

Figure 5:
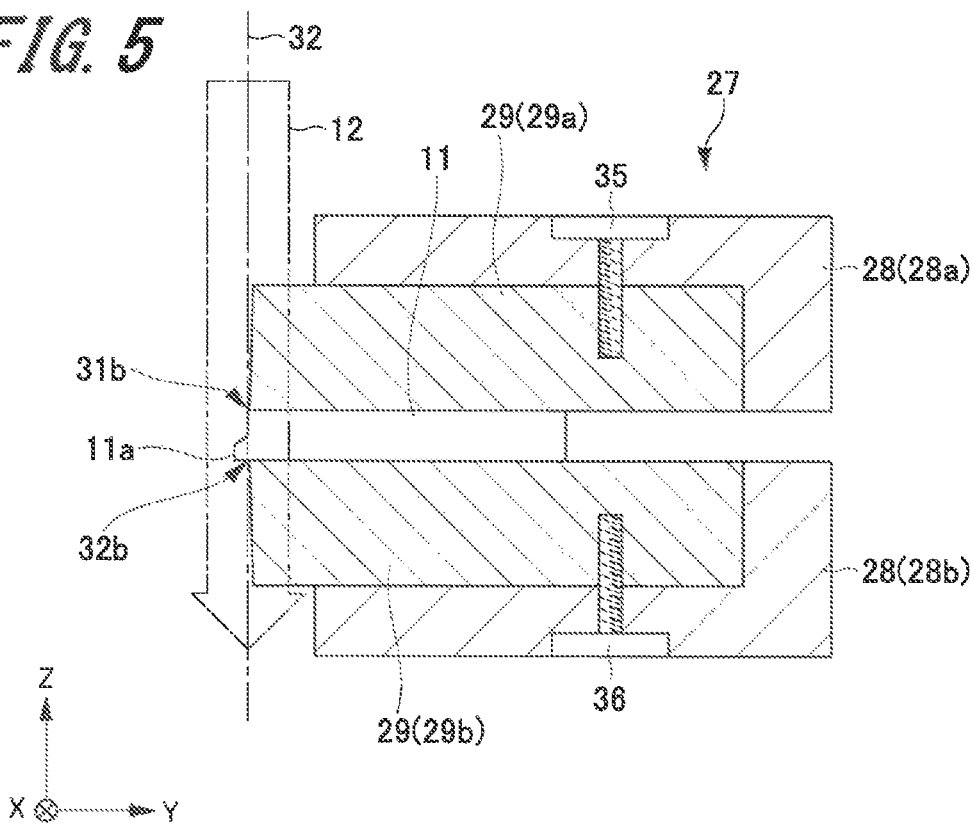
FIG. 5 is a diagram (part 2) for describing a procedure in the case of processing the sample using the ion milling apparatus according to the first embodiment of the present invention.
Figure 6:
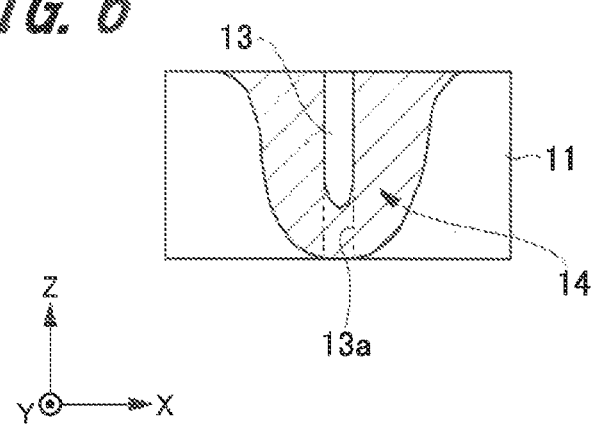
FIG. 6 is a diagram (part 2) illustrating a state of the sample processed with the ion milling apparatus according to the first embodiment of the present invention.

In the first processing step, the sample 11 is irradiated with the ion beam 12 via the first shielding member 29a by emitting the ion beam 12 from the ion source 17 in a state illustrated in FIG. 3. At this time, the ion source 17 emits the ion beam 12 when the voltage power supply 24 receives a control command from the ion source control unit 23a and applies a voltage to the ion source 17. As a result, the sample 11 is etched by irradiation with the ion beam 12 as illustrated in FIG. 5. At this time, the sample 11 is etched more (faster) on an upstream side where a current density is high in an irradiation direction of the ion beam 12, that is, the upper side than the lower side. Therefore, in the first embodiment of the present invention, the first processing step ends in a stage in which a cross section 14 including the through-hole 13 appears in the sample 11 due to the irradiation of the ion beam 12 described above, as illustrated in FIG. 6 and a part 13a of the through-hole 13 remains without being subjected to cross-section processing. At this stage, as illustrated in FIGS. 5 and 6, part of the sample 11 protruding from the edge portion 31b of the first shielding member 29a remains as a protrusion 11a, and the lower side of the cross section 14 of the sample 11 is inclined.

Figure 7:
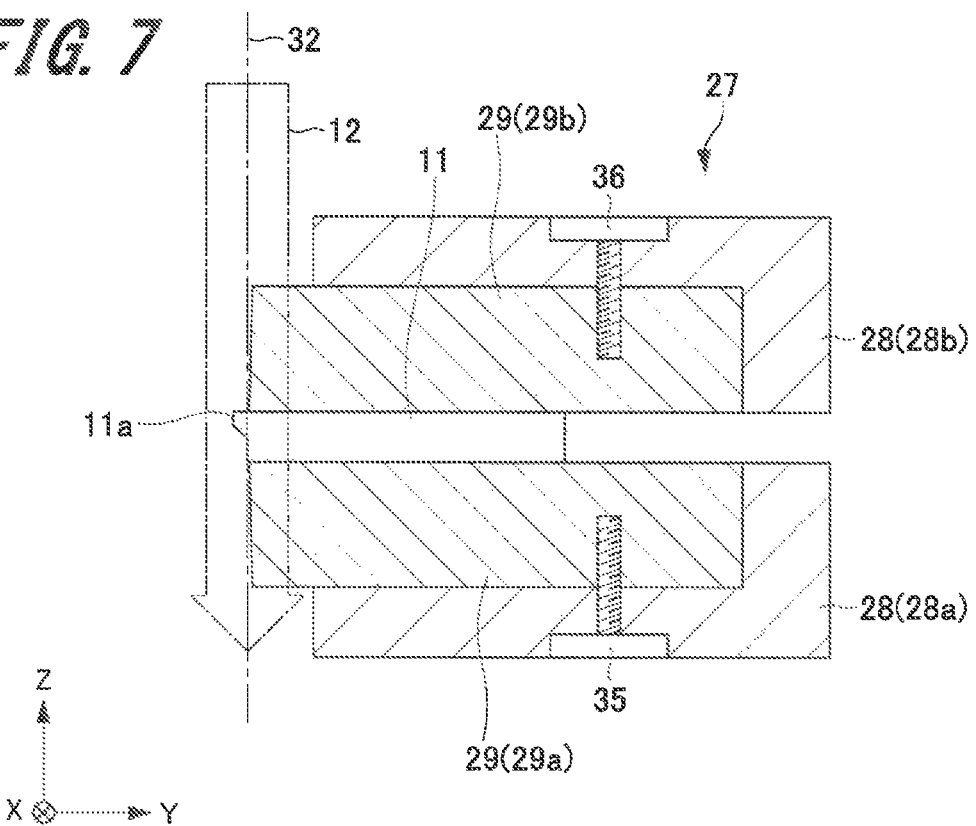
FIG. 7 is a diagram (part 3) for describing a procedure in the case of processing the sample using the ion milling apparatus according to the first embodiment of the present invention.
Figure 8:
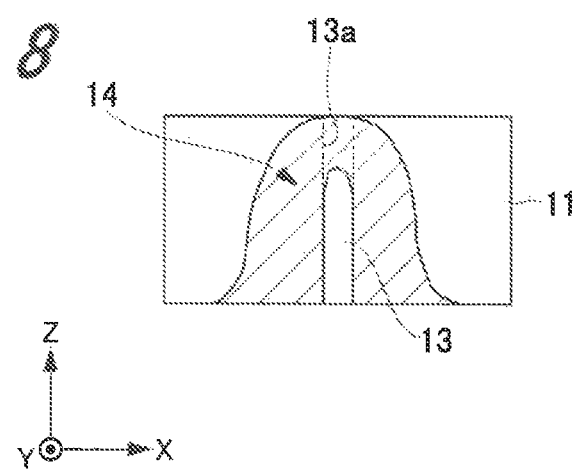
FIG. 8 is a diagram (part 3) illustrating a state of the sample processed with the ion milling apparatus according to the first embodiment of the present invention.

Next, the inside of the vacuum chamber 15 is returned to a normal temperature and normal pressure state, and the sample stage 18 is pulled out to the outside of the vacuum chamber 15 by the sample stage pull-out mechanism 16. Next, after the sample holder 27 is removed from the sample stage 18, the orientation of the sample holder 27 is changed. Specifically, as illustrated in FIG. 7, the orientation of the sample holder 27 is vertically inverted, and the sample holder 27 is mounted on the sample stage 18. Next, the sample stage 18 is pushed into the vacuum chamber 15 by the sample stage pull-out mechanism 16, whereby the sample stage 18 is accommodated in the vacuum chamber 15. As a result, the sample 11 and the sample holder 27 are accommodated in the vacuum chamber 15 together with the sample stage 18. In addition, as illustrated in FIG. 8, the sample 11 is arranged in an orientation in which the part 13a of the through-hole 13 is located on the upper side. In addition, as illustrated in FIG. 7, the protrusion 11a of the sample 11, which is a processing residue in the first processing step, is arranged on the upper side by vertically inverting the sample holder 27 described above.

Second Processing Step

Figure 9:
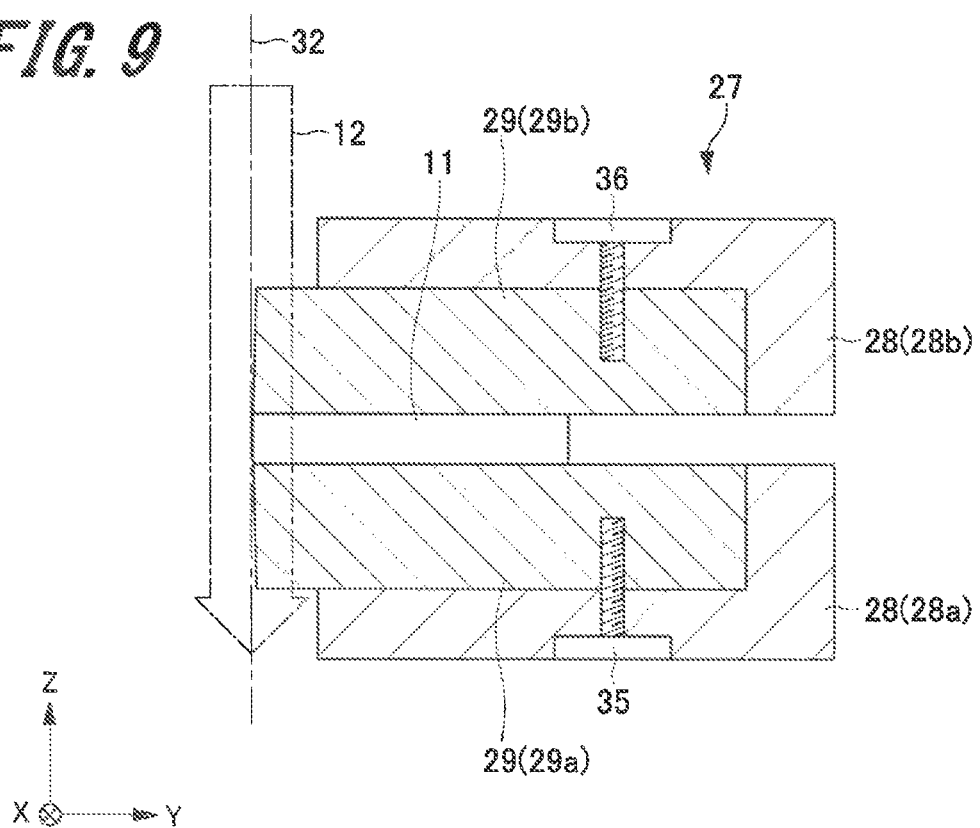
FIG. 9 is a diagram (part 4) for describing a procedure in the case of processing the sample using the ion milling apparatus according to the first embodiment of the present invention.
Figure 10:
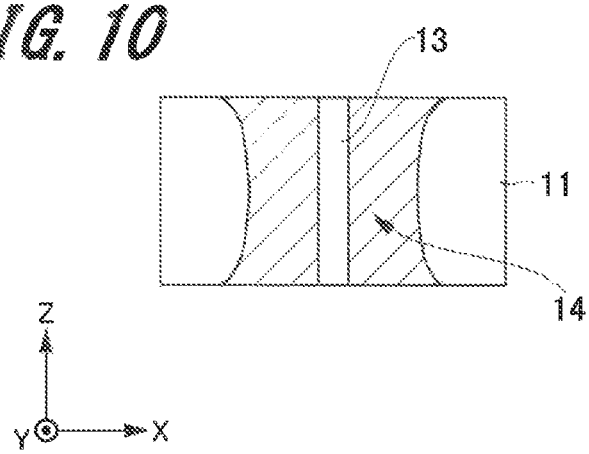
FIG. 10 is a diagram (part 4) illustrating a state of the sample processed with the ion milling apparatus according to the first embodiment of the present invention.

In the second processing step, the sample 11 is irradiated with the ion beam 12 via the second shielding member 29b by emitting the ion beam 12 from the ion source 17 in a state illustrated in FIG. 7. As a result, the sample 11 is etched by irradiation with the ion beam 12 as illustrated in FIG. 9. At this time, the protrusion 11a (see FIG. 7) of the sample 11 is arranged on the upstream side where the current density is high in the irradiation direction of the ion beam 12, that is, on the upper side. Therefore, the protrusion 11a of the sample 11 is efficiently etched by irradiation with the ion beam 12. In the first embodiment of the present invention, the second processing step ends in a stage in which the entire through-hole 13 appears in the cross section 14 of the sample 11 due to the irradiation of the ion beam 12 described above, as illustrated in FIG. 10 and the inclination of the cross section 14 is reduced to be sufficiently small.

Effects of First Embodiment

As described above, the ion milling apparatus 10 according to the first embodiment of the present invention includes the pair of shielding members 29 sandwiching the sample 11. Then, in the first processing step, the sample 11 is irradiated with the ion beam 12 via the first shielding member 29a, and in the second processing step, the sample 11 is irradiated with the ion beam 12 via the second shielding member 29b. As a result, the sample 11 can be processed by irradiating the sample 11 with the ion beam 12 from one side and the other side in the Z direction. That is, the sample 11 can be processed from both upper and lower surfaces. Therefore, it is possible to efficiently manufacture the sample 11 having the cross section 14 whose inclination is reduced. In addition, processing time until a desired processed cross section is obtained can be shortened.

The effect of shortening the processing time can be more remarkably obtained, for example, in a case where the through-hole 13 of the sample 11 having a large thickness dimension is exposed to the outside by cross-section processing using the ion beam 12. Specifically, when the sample 11 is irradiated with the ion beam 12 from only the one side in the Z direction, the processing rate decreases due to a decrease in the current density of the ion beam 12 on the downstream side of the ion beam 12 where a distance from the ion source 17 increases, and the processing time until a desired processed cross section is obtained increases. In contrast, when the sample 11 is irradiated with the ion beam 12 from the one side and the other side in the Z direction, the sample 11 can be processed in a state in which the current density of the ion beam 12 is high, that is, at a high processing rate. Therefore, the processing time until a desired processed cross section is obtained can be shortened as compared with a case where the ion beam 12 is irradiated only from the one side in the Z direction.

Note that in the first embodiment, first, the sample 11 is irradiated with the ion beam 12 via the first shielding member 29a, and then the sample 11 is irradiated with the ion beam 12 via the second shielding member 29b. However, the present invention is not limited thereto, and the processing order may be reversed. Specifically, first, the sample 11 may be irradiated with the ion beam 12 via the second shielding member 29b, and then the sample 11 may be irradiated with the ion beam 12 via the first shielding member 29a.

In addition, in the first embodiment, after the first processing step ends and before the second processing step starts, the orientation of the sample holder 27 attached to the sample stage 18 is vertically inverted. However, the present invention is not limited thereto, and the position of the ion source 17 may be vertically inverted instead of vertically inverting the orientation of the sample holder 27.

In addition, in the first embodiment, in a case where the sample 11 is irradiated with the ion beam 12 via the first shielding member 29a, the sample 11 may be inclined by the rotation mechanism 19. This point similarly applies to a case where the sample 11 is irradiated with the ion beam 12 via the second shielding member 29b. By performing such an inclination operation in the first processing step and the second processing step, it is possible to remove processing streaks generated in an ion beam irradiation direction and expand a range of the ion beam 12 with which the sample 11 is irradiated, that is, a processing range. In addition, in the case of performing the inclination operation described above, it is preferable that the sample stage 18 has a eucentric function so that the upper surface of the sample 11 arranged vertically upward becomes the eucentric center.

Second Embodiment

Next, a second embodiment of the present invention will be described.

An ion milling apparatus 10 according to the second embodiment of the present invention is configured to be switchable between a first mode and a second mode described above by rotating a sample holder 27 by a rotation mechanism 19.

Figure 11:
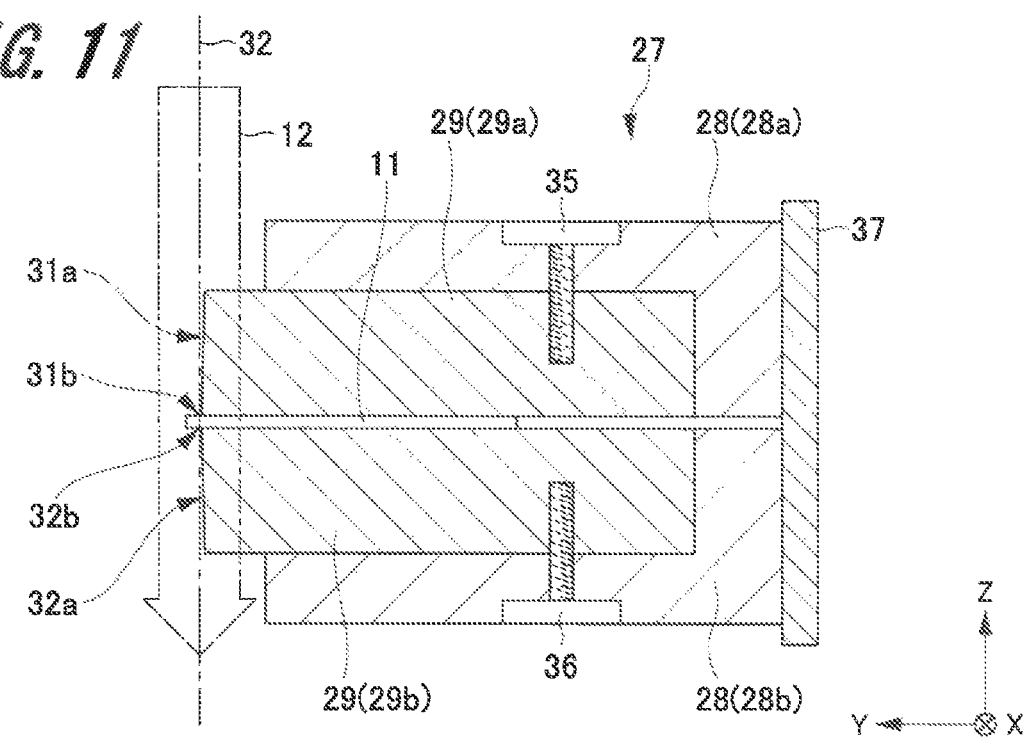
FIG. 11 is an enlarged diagram of a main part of an ion milling apparatus according to a second embodiment of the present invention.

FIG. 11 is an enlarged diagram of a main part of the ion milling apparatus 10 according to the second embodiment of the present invention.

As illustrated in FIG. 11, the sample holder 27 includes a pair of shielding members 29 (29a and 29b) sandwiching a sample 11, and a pair of holder bodies 28 (28a and 28b) supporting the sample 11 via the pair of shielding members 29. The pair of holder bodies 28 is attached to a rotating body 37. Therefore, the sample 11, the pair of shielding members 29, and the pair of holder bodies 28 rotate integrally with the rotating body 37. The rotating body 37 is one of elements constituting the rotation mechanism 19 described above. The rotation mechanism 19 is capable of rotating the sample holder 27 by 360°. However, in order to switch between the first mode and the second mode by the rotation of the sample holder 27, the rotation mechanism 19 only needs to be capable of rotating the sample holder 27 by 180°. The technical significance of being capable of rotating the sample holder 27 by 360° will be described later.

Next, procedures in the case of processing the sample 11 using the ion milling apparatus 10 according to the second embodiment of the present invention will be described. The procedures to be described below include a method of manufacturing a sample.

Figure 12:
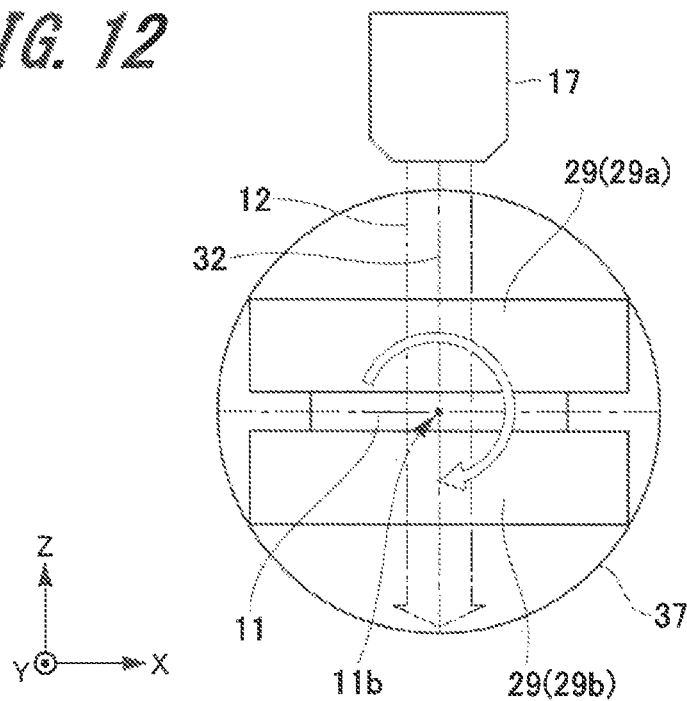
FIG. 12 is a diagram (part 1) for describing a procedure in the case of processing a sample using the ion milling apparatus according to the second embodiment of the present invention.

First, as illustrated in FIG. 12, the sample 11 is sandwiched by the pair of shielding members 29 with a first shielding member 29a on an upper side and a second shielding member 29b on a lower side, and in this state, the sample holder 27 is mounted on a sample stage 18. Next, after a protruding amount of the sample 11 is confirmed using a camera 22 and a display unit 26, the sample stage 18 is accommodated in a vacuum chamber 15. The procedures described so far are similar to the procedures in the first embodiment described above. The subsequent procedures are automatically performed under the control of an evacuation control unit 21 and a control unit 23 (ion source control unit 23a and rotation control unit 23b).

Next, the evacuation control unit 21 drives an evacuation unit 20 to evacuate air in the vacuum chamber 15. In addition, the evacuation control unit 21 maintains the inside of the vacuum chamber 15 at a predetermined degree of vacuum until the processing of the sample 11 ends.

Next, the control unit 23 processes the sample 11 by irradiating the sample 11 with an ion beam 12 while the sample holder 27 is rotated. The rotation of the sample holder 27 is performed by a rotation drive unit 25 driving the rotation mechanism 19 according to a control command from the rotation control unit 23b. The irradiation of the ion beam 12 is performed by a voltage power supply 24 applying a voltage to the ion source 17 according to a control command from the ion source control unit 23a.

Figure 13:
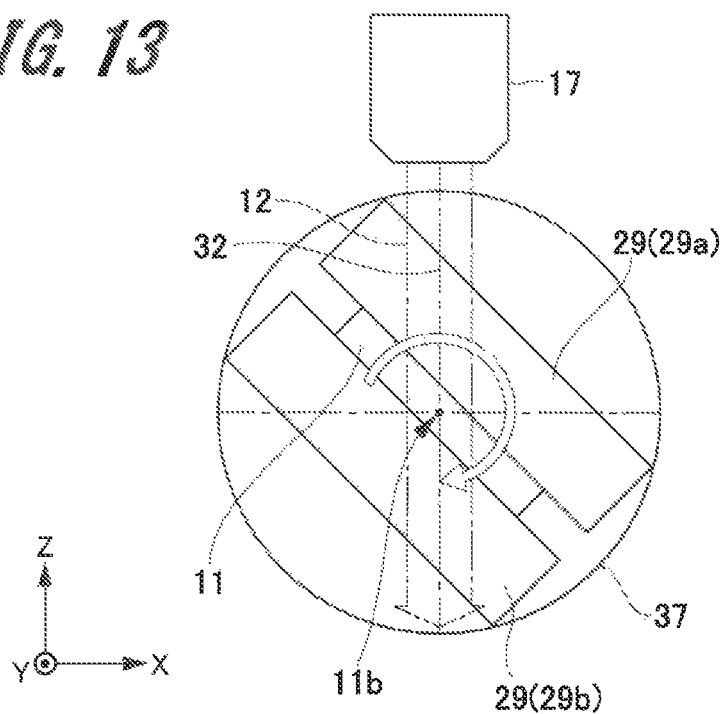
FIG. 13 is a diagram (part 2) for describing a procedure in the case of processing the sample using the ion milling apparatus according to the second embodiment of the present invention.
Figure 14:
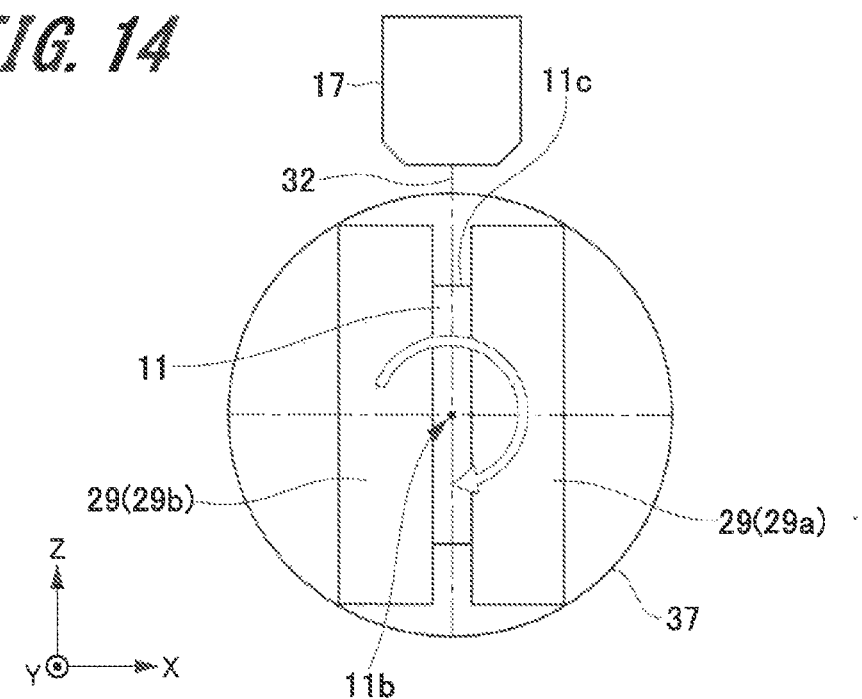
FIG. 14 is a diagram (part 3) for describing a procedure in the case of processing the sample using the ion milling apparatus according to the second embodiment of the present invention.
Figure 15:
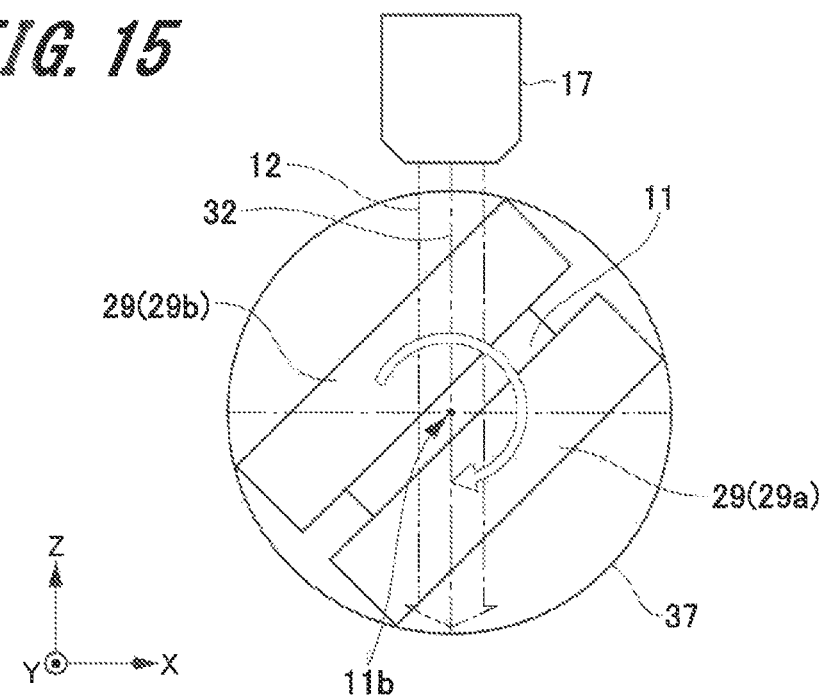
FIG. 15 is a diagram (part 4) for describing a procedure in the case of processing the sample using the ion milling apparatus according to the second embodiment of the present invention.
Figure 16:
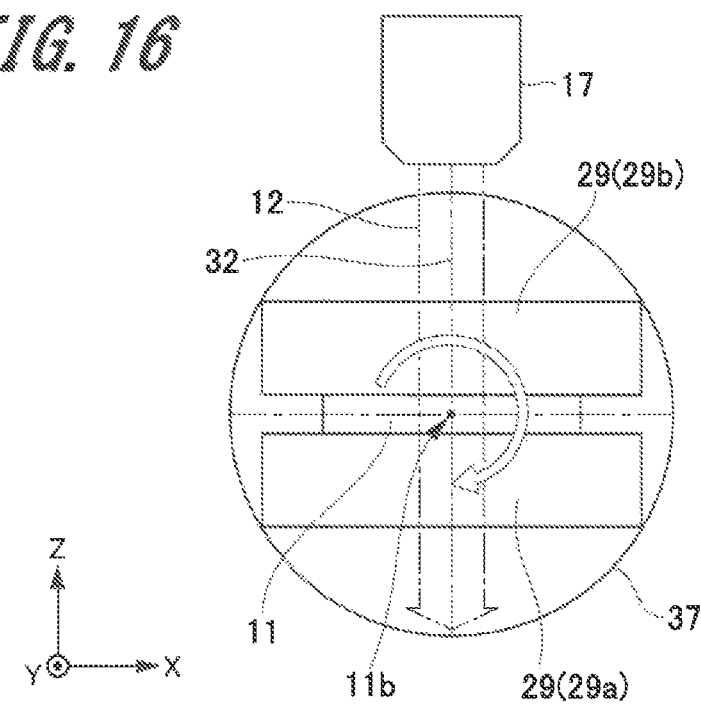
FIG. 16 is a diagram (part 5) for describing a procedure in the case of processing the sample using the ion milling apparatus according to the second embodiment of the present invention.
Figure 17:
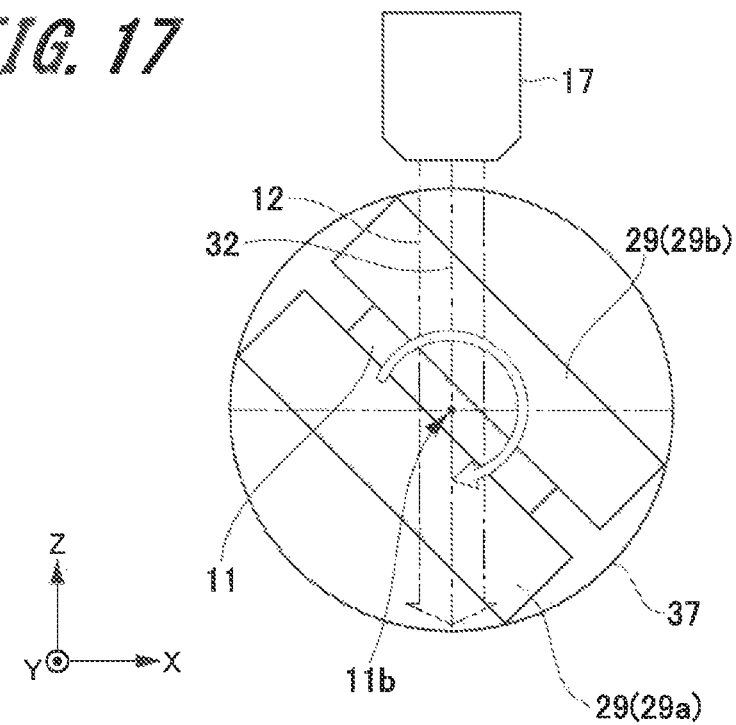
FIG. 17 is a diagram (part 6) for describing a procedure in the case of processing the sample using the ion milling apparatus according to the second embodiment of the present invention.
Figure 18:
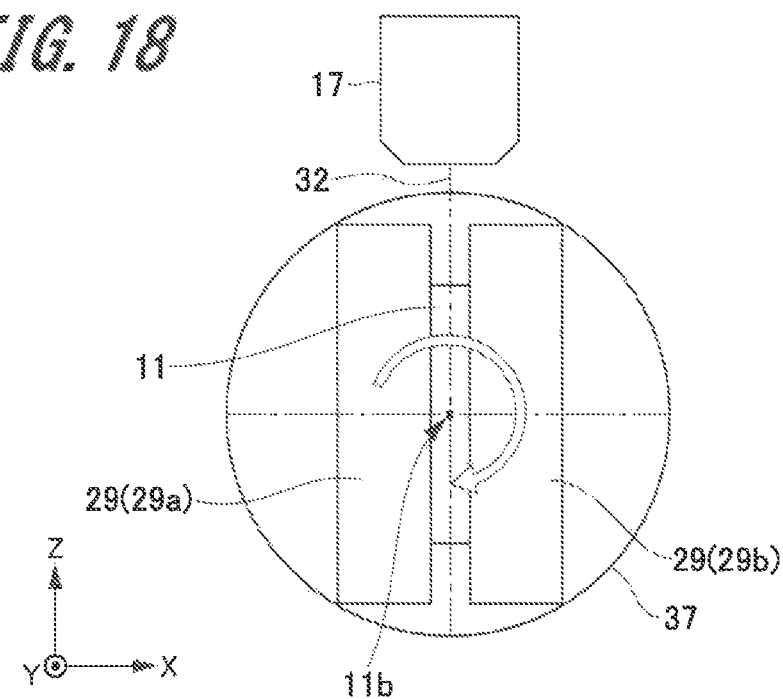
FIG. 18 is a diagram (part 7) for describing a procedure in the case of processing the sample using the ion milling apparatus according to the second embodiment of the present invention.
Figure 19:
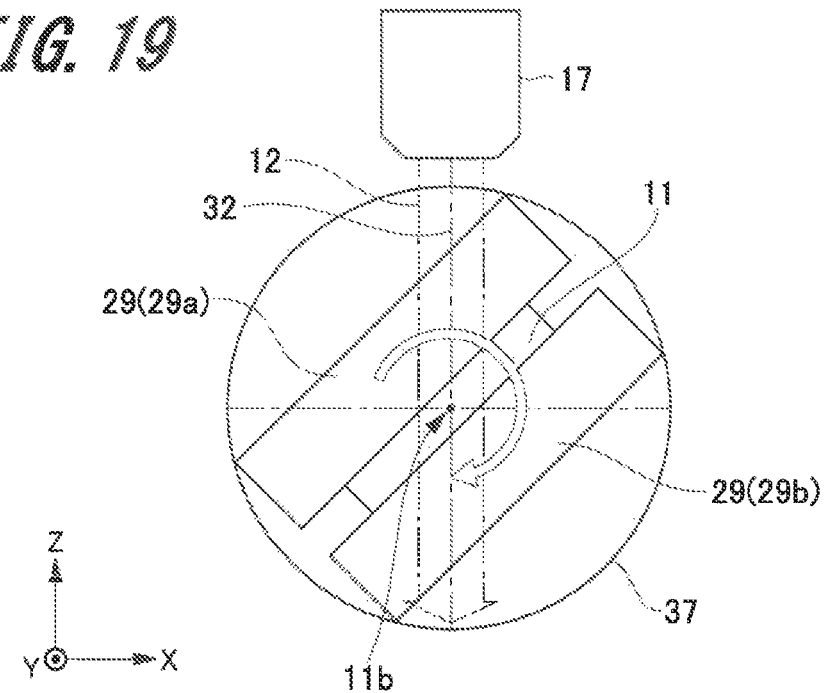
FIG. 19 is a diagram (part 8) for describing a procedure in the case of processing the sample using the ion milling apparatus according to the second embodiment of the present invention.

FIGS. 12 to 19 are time-series diagrams illustrating how the sample 11 is processed using the ion milling apparatus 10 according to the second embodiment of the present invention. FIG. 12 illustrates a state in which a rotation angle of the sample 11 is 0°, and FIG. 13 illustrates a state in which the rotation angle of the sample 11 is 45°. FIG. 14 illustrates a state in which the rotation angle of the sample 11 is 90°, and FIG. 15 illustrates a state in which the rotation angle of the sample 11 is 135°. FIG. 16 illustrates a state in which the rotation angle of the sample 11 is 180°, and FIG. 17 illustrates a state in which the rotation angle of the sample 11 is 225°. FIG. 18 illustrates a state in which the rotation angle of the sample 11 is 270°, and FIG. 19 illustrates a state in which the rotation angle of the sample 11 is 315°. Note that a state in which the rotation angle of the sample 11 is 360° is the same as the state in which the rotation angle of the sample 11 is 0°.

First, as illustrated in FIG. 12, the control unit 23 irradiates the sample 11 with the ion beam 12 from the ion source 17 in a state in which the first shielding member 29a is arranged on the upper side and the second shielding member 29b is arranged on the lower side. At this point, each of the first shielding member 29a and the second shielding member 29b is arranged parallel to a horizontal plane. In addition, the sample 11 is irradiated with the ion beam 12 via the first shielding member 29a, and the sample 11 is arranged vertically without being inclined with respect to a central axis 32 of the ion beam 12.

Next, as illustrated in FIG. 13, the control unit 23 rotates the sample 11 integrally with the pair of shielding members 29 (29a and 29b) while the sample 11 is irradiated with the ion beam 12 from the ion source 17. At this time, the sample 11 is irradiated with the ion beam 12 via the first shielding member 29a. In addition, the sample 11 is arranged to be inclined downward to the right in the figure with respect to the central axis 32 of the ion beam 12. The sample 11 is rotated by the rotation mechanism 19. At this time, the rotation mechanism 19 rotates the sample 11 together with the rotating body 37. A processing position 11b of the sample 11 is arranged on the central axis 32 of the ion beam 12. Note that in FIG. 13, the sample 11 is rotated in a clockwise direction in the figure, but the rotation direction of the sample 11 may be a counterclockwise direction.

Next, as illustrated in FIG. 14, the control unit 23 stops the irradiation of the sample 11 with the ion beam 12 from the ion source 17. The irradiation of the ion beam 12 is stopped when the voltage is not applied from the voltage power supply 24 to the ion source 17. A timing of stopping the irradiation of the ion beam 12 is controlled by the ion source control unit 23a. Specifically, the ion source control unit 23a controls the voltage power supply 24 to stop the irradiation of the ion beam 12 at a timing at which the ion beam 12 emitted from the ion source 17 cannot be shielded by the shielding member 29 (29a) or a timing before the timing is reached (more preferably, immediately before the timing is reached). The timing at which the ion beam 12 cannot be shielded by the shielding member 29 refers to a timing at which the sample 11 is irradiated directly with the ion beam 12 emitted from the ion source 17.

By stopping the irradiation of the ion beam 12 as described above, the processing of a side surface 11c of the sample 11 can be reduced.

Next, as illustrated in FIG. 15, the control unit 23 restarts the irradiation of the sample 11 with the ion beam 12 from the ion source 17. At this time, the sample 11 is irradiated with the ion beam 12 via the second shielding member 29b. In addition, the sample 11 is arranged to be inclined upward in the figure with respect to the central axis 32 of the ion beam 12. A timing of restarting the irradiation of the ion beam 12 is controlled by the ion source control unit 23a. Specifically, the ion source control unit 23a controls the voltage power supply 24 to restart the irradiation of the ion beam 12 at a timing at which the ion beam 12 emitted from the ion source 17 can be shielded by the shielding member 29 (29b) or a timing after the timing is reached (more preferably, immediately after the timing is reached). The timing at which the ion beam 12 can be shielded by the shielding member 29 refers to a timing at which the sample 11 is not irradiated directly with the ion beam 12 emitted from the ion source 17.

By restarting the irradiation of the ion beam 12 as described above, the sample 11 can be processed while the side surface 11c of the sample 11 is avoided.

Next, as illustrated in FIG. 16, the control unit 23 rotates the sample 11 integrally with the pair of shielding members 29 (29a and 29b) while the sample 11 is irradiated with the ion beam 12 from the ion source 17. At this point, each of the first shielding member 29a and the second shielding member 29b is arranged while being parallel to the horizontal plane, the second shielding member 29b is arranged on the upper side, and the first shielding member 29a is arranged on the lower side. That is, at a time point of FIG. 16 and a time point of FIG. 12, a positional relationship between the pair of shielding members 29 (29a and 29b) is reversed upside down. In addition, at the time point of FIG. 16, the sample 11 is irradiated with the ion beam 12 via the second shielding member 29b, and the sample 11 is arranged vertically without being inclined with respect to the central axis 32 of the ion beam 12.

Next, as illustrated in FIG. 17, the control unit 23 rotates the sample 11 integrally with the pair of shielding members 29 (29a and 29b) while the sample 11 is irradiated with the ion beam 12 from the ion source 17. At this time, the sample 11 is irradiated with the ion beam 12 via the second shielding member 29b. In addition, the sample 11 is arranged to be inclined downward to the right in the figure with respect to the central axis 32 of the ion beam 12.

Next, as illustrated in FIG. 18, the control unit 23 stops the irradiation of the sample 11 with the ion beam 12 from the ion source 17. A timing of stopping the irradiation of the ion beam 12 is as described above.

Next, as illustrated in FIG. 19, the control unit 23 restarts the irradiation of the sample 11 with the ion beam 12 from the ion source 17. At this time, the sample 11 is irradiated with the ion beam 12 via the first shielding member 29a. In addition, the sample 11 is arranged to be inclined upward in the figure with respect to the central axis 32 of the ion beam 12. A timing of restarting the irradiation of the ion beam 12 is as described above.

Thereafter, as illustrated in FIG. 12, the control unit 23 rotates the sample 11 in a state in which the first shielding member 29a is arranged on the upper side and the second shielding member 29b is arranged on the lower side, that is, until the rotation angle of the sample 11 reaches 360°. In addition, the control unit 23 continues a rotation operation of the sample 11 until a sample cross section is formed, and stops the rotation of the sample 11 and stops the irradiation of the ion beam 12 when the sample cross section is created.

Effects of Second Embodiment

As described above, the ion milling apparatus 10 according to the second embodiment of the present invention has a first processing mode and a second processing mode. The first processing mode is a mode of irradiating the sample 11 with the ion beam 12 via the first shielding member 29a by rotating the sample 11 sandwiched by the pair of shielding members 29 together with the rotating body 37. The second processing mode is a mode of irradiating the sample 11 with the ion beam 12 via the second shielding member 29b by rotating the sample 11 sandwiched by the pair of shielding members 29 together with the rotating body 37. As a result, the sample 11 can be processed from both upper and lower surfaces. Therefore, it is possible to efficiently manufacture the sample 11 having a cross section whose inclination is reduced, and it is possible to shorten processing time until a desired processed cross section is obtained.

In addition, in the second embodiment of the present invention, the sample 11 is processed by irradiating the sample 11 with the ion beam 12 while the sample 11 is rotated integrally with the sample holder 27 and the rotating body 37. Thus, it is possible to cancel processing streaks generated by the irradiation of the ion beam 12. Thus, the sample 11 having a cross section with few processing streaks can be manufactured. In addition, by rotating the sample holder 27 supporting the sample 11 by 360°, the processing streaks can be canceled without unevenness.

In addition, in the first embodiment described above, it is necessary to change an orientation when the sample holder 27 is mounted on the sample stage 18 in order to vertically invert the positional relationship between the pair of shielding members 29. Therefore, it is necessary to provide a processing interruption step between the first processing step and the second processing step. The processing interruption step is to return the inside of the vacuum chamber 15 to a normal temperature and normal pressure state or to change the orientation of the sample holder 27 by pulling out the sample stage 18 from the vacuum chamber 15. In contrast, in the second embodiment, the rotation mechanism 19 rotates the sample holder 27, whereby the positional relationship between the pair of shielding members 29 can be vertically inverted. Therefore, in the second embodiment, after the vacuum chamber 15 is set to a predetermined degree of vacuum, the processing of the sample 11 can be continued without providing the processing interruption step described above. Therefore, according to the second embodiment, the processing of the sample 11 can end in a shorter time than in the first embodiment.

Note that in the second embodiment, the application of the voltage from the voltage power supply 24 to the ion source 17 is stopped, whereby the irradiation of the sample 11 with the ion beam 12 is stopped, but the present invention is not limited thereto. For example, the irradiation of the sample 11 with the ion beam 12 may be stopped by blocking the ion beam 12 emitted from the ion beam 12 with a shutter (not illustrated) arranged on an upstream side of the sample holder 27 while the application of the voltage from the voltage power supply 24 to the ion source 17 is continued.

In addition, in the second embodiment, the rotation control unit 23b may rotate the sample 11 integrally with the sample holder 27 by 360° at a constant speed by controlling the rotation of the sample holder 27 via the rotation drive unit 25, or may change the rotation speed of the sample holder 27 in the middle. For example, in a period in which the sample 11 is rotated by 360°, the rotation control unit 23b may variably control the rotation speed of the sample holder 27 so that the sample 11 is rotated at a first speed during a period in which the sample 11 is irradiated with the ion beam 12 and the sample 11 is rotated at a second speed higher than the first speed during a period in which the sample 11 is not irradiated with the ion beam 12. By variably controlling the rotation speed of the sample holder 27 in this manner, it is possible to shorten time that does not contribute to processing of the sample 11 as compared with a case where the rotation speed of the sample holder 27 is controlled at a constant speed. Therefore, the sample 11 can be efficiently processed.

In addition, the rotation control unit 23b may control the rotation of the sample holder 27 so that a first inclination operation and a second inclination operation are repeated at least once, preferably a plurality of times. The first inclination operation is an operation in which a state changes from a state illustrated in FIG. 15, through a state illustrated in FIG. 16, and to a state illustrated in FIG. 17. The second inclination operation is an operation that is opposite to the first inclination operation and in which a state changes from the state illustrated in FIG. 17, through the state illustrated in FIG. 16, and to the state illustrated in FIG. 15. Similarly, the rotation control unit 23b may control the rotation of the sample holder 27 so that a first tilting operation and a second inclination operation are repeated at least once, preferably a plurality of times. The first inclination operation is an operation in which a state changes from a state illustrated in FIG. 19, through a state illustrated in FIG. 12, and to a state illustrated in FIG. 13. The second inclination operation is an operation that is opposite to the first inclination operation and in which a state changes from the state illustrated in FIG. 13, through the state illustrated in FIG. 12, and to the state illustrated in FIG. 19. By controlling the rotation of the sample holder 27 in this manner, it is possible to expand a range of the ion beam 12 with which the sample 11 is irradiated, that is, a processing range can be expanded. In addition, in a case where the first inclination operation and the second inclination operation described above are performed, it is preferable that the sample stage 18 has a eucentric function so that the upper surface of the sample 11 arranged vertically upward becomes the eucentric center.

Third Embodiment

Next, a third embodiment of the present invention will be described.

Figure 20:
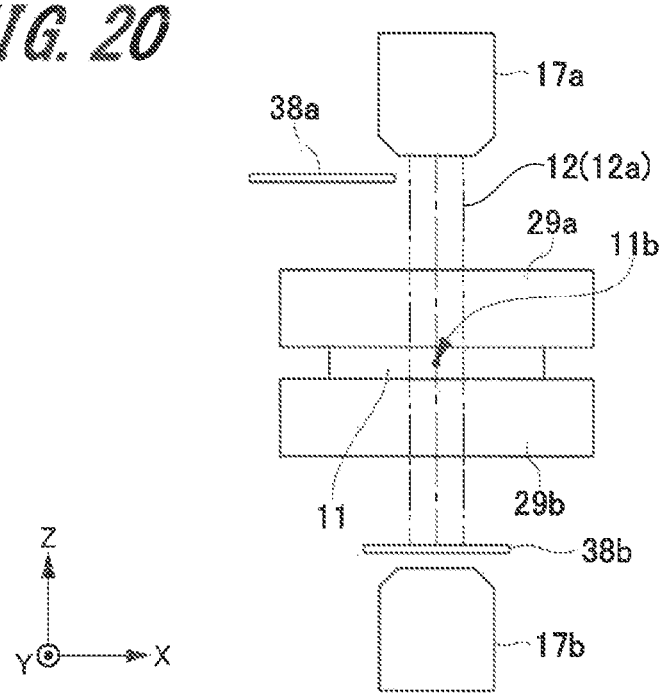
FIG. 20 is a diagram (part 1) for describing a configuration and an operation of an ion milling apparatus according to a third embodiment of the present invention.
Figure 21:
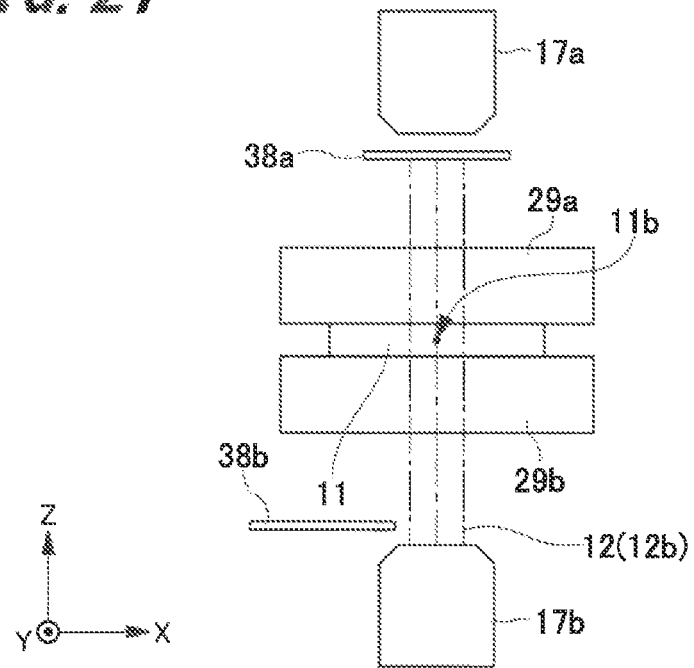
FIG. 21 is a diagram (part 2) for describing the configuration and an operation of the ion milling apparatus according to the third embodiment of the present invention.

A configuration of an ion milling apparatus 10 according to the third embodiment of the present invention is in common with the configuration of the ion milling apparatus 10 in the first embodiment described above in that a sample 11 is sandwiched and supported by a pair of shielding members 29. However, the configuration of the ion milling apparatus according to the third embodiment is different from the configuration of the first embodiment in the number of ion sources 17. Specifically, as illustrated in FIGS. 20 and 21, the ion milling apparatus 10 according to the third embodiment includes a first ion source 17a and a second ion source 17b.

The first ion source 17a and the second ion source 17b are arranged to face each other on the same axis passing through a processing position 11b of the sample 11. The first ion source 17a emits an ion beam 12 vertically downward, and the second ion source 17b emits an ion beam 12 vertically upward. That is, the first ion source 17a and the second ion source 17b emit the ion beams 12 in directions opposite to each other in a vertical direction. In addition, the first ion source 17a irradiates the sample 11 with the ion beam 12 via a first shielding member 29a, and the second ion source 17b irradiates the sample 11 with the ion beam 12 via a second shielding member 29b.

In addition, the ion milling apparatus 10 according to the third embodiment includes a first shutter 38a and a second shutter 38b. The first shutter 38a is arranged in the vicinity of the first ion source 17a. In addition, the first shutter 38a is arranged between the first ion source 17a and the first shielding member 29a in a Z direction. The second shutter 38b is arranged in the vicinity of the second ion source 17b. In addition, the second shutter 38b is arranged between the second ion source 17b and the second shielding member 29b in the Z direction.

The first shutter 38a is a shutter that blocks an ion beam 12b emitted from the second ion source 17b before the first ion source 17a. The second shutter 38b is a shutter that blocks an ion beam 12a emitted from the first ion source 17a before the second ion source 17b. The first shutter 38a and the second shutter 38b each includes a material that is difficult to be etched even when the material is irradiated with the ion beam 12, for example, titanium.

The first shutter 38a is provided so as to be arrangeable at an opened position illustrated in FIG. 20 and a closed position illustrated in FIG. 21. The second shutter 38b is provided so as to be arrangeable at an opened position illustrated in FIG. 21 and a closed position illustrated in FIG. 20. The arrangements of each of the first shutter 38a and the second shutter 38b are switched by a switching mechanism (not illustrated). The switching mechanism switches the arrangements of each of the first shutter 38a and the second shutter 38b using, for example, a solenoid or a motor as a drive source. In addition, the operation of the switching mechanism is controlled by a control unit 23.

In a case where the first shutter 38a is arranged at the opened position, the passage of the ion beam 12a emitted from the first ion source 17a is allowed by the first shutter 38a. In a case where the first shutter 38a is arranged at the closed position, the passage of the ion beam 12b emitted from the second ion source 17b is blocked by the first shutter 38a.

In a case where the second shutter 38b is arranged at the opened position, the passage of the ion beam 12b emitted from the second ion source 17b is allowed by the second shutter 38b. In a case where the second shutter 38b is arranged at the closed position, the passage of the ion beam 12a emitted from the first ion source 17a is blocked by the second shutter 38b.

Therefore, as illustrated in FIG. 20, when the first shutter 38a is arranged at the opened position, the second shutter 38b is arranged at the closed position, and the ion beam 12a is emitted from the first ion source 17a, the sample 11 is irradiated with the ion beam 12a via the first shielding member 29a. Therefore, the sample 11 is processed from an upper surface side toward a lower surface side. In addition, the ion beam 12a is blocked by the second shutter 38b before the second ion source 17b. Therefore, damage to the second ion source 17b due to the irradiation with the ion beam 12a is reduced. Consequently, the second ion source 17b can be protected from the ion beam 12a.

Meanwhile, as illustrated in FIG. 21, when the first shutter 38a is arranged at the closed position, the second shutter 38b is arranged at the opened position, and the ion beam 12b is emitted from the second ion source 17b, the sample 11 is irradiated with the ion beam 12b via the second shielding member 29b. Therefore, the sample 11 is processed from the lower surface side toward the upper surface side. In addition, the ion beam 12b is blocked by the first shutter 38a before the first ion source 17a. Therefore, damage to the first ion source 17a due to the irradiation with the ion beam 12b is reduced. Consequently, the first ion source 17a can be protected from the ion beam 12b.

Next, procedures in the case of processing the sample 11 using the ion milling apparatus 10 according to the third embodiment of the present invention will be described. The procedures to be described below include a method of manufacturing a sample.

First, as illustrated in FIG. 20, the sample 11 is sandwiched by the pair of shielding members 29 with the first shielding member 29a on an upper side and the second shielding member 29b on a lower side, and in this state, the sample holder 27 is mounted on a sample stage 18. Next, after a protruding amount of the sample 11 is confirmed using a camera 22 and a display unit 26, the sample stage 18 is accommodated in a vacuum chamber 15. The procedures described so far are similar to the procedures in the first embodiment described above.

Next, by driving the switching mechanism described above, the control unit 23 arranges the first shutter 38a at the opened position and arranges the second shutter 38b at the closed position as illustrated in FIG. 20. Next, a voltage power supply 24 receives a control command from an ion source control unit 23a and applies a voltage to the first ion source 17a. As a result, the first ion source 17a emits the ion beam 12a. The sample 11 is irradiated with the ion beam 12a via the first shielding member 29a. Thereafter, when the time of irradiation with the ion beam 12a by the first ion source 17a reaches predetermined time, the voltage power supply 24 receives a control command from the ion source control unit 23a and stops applying a voltage to the first ion source 17a. As a result, the first ion source 17a stops emitting the ion beam 12a.

Next, by driving the switching mechanism described above, the control unit 23 arranges the first shutter 38a at the closed position and arranges the second shutter 38b at the opened position as illustrated in FIG. 21. Next, the voltage power supply 24 receives a control command from the ion source control unit 23a and applies a voltage to the second ion source 17b. As a result, the second ion source 17b emits the ion beam 12b. The sample 11 is irradiated with the ion beam 12b via the second shielding member 29b. Thereafter, when the time of irradiation with the ion beam 12b by the second ion source 17b reaches predetermined time, the voltage power supply 24 receives a control command from the ion source control unit 23a and stops applying the voltage to the second ion source 17b. As a result, the second ion source 17b stops emitting the ion beam 12b.

Effects of Third Embodiment

As described above, in the ion milling apparatus 10 according to the third embodiment of the present invention, the first ion source 17a irradiates the sample 11 sandwiched by the pair of shielding members 29 with the ion beam 12a via the first shielding member 29a, and the second ion source 17b irradiates the sample with the ion beam 12b via the second shielding member 29b. As a result, the sample 11 can be processed from both upper and lower surfaces. Therefore, it is possible to efficiently manufacture the sample 11 having a cross section whose inclination is reduced, and it is possible to shorten processing time until a desired processed cross section is obtained.

In addition, in the ion milling apparatus 10 according to the third embodiment, optical axes of the first ion source 17a and the second ion source 17b are adjustable, and the first ion source 17a and the second ion source 17b are arranged to face each other on the same axis passing through the processing position 11b of the sample 11. As a result, an irradiation position of the ion beam 12a with which the sample 11 is irradiated from the first ion source 17a and an irradiation position of the ion beam 12b with which the sample 11 is irradiated from the second ion source 17b can be easily and accurately aligned with each other.

In addition, the ion milling apparatus 10 according to the third embodiment includes the first shutter 38a that blocks the ion beam 12b emitted from the second ion source 17b before the first ion source 17a, and the second shutter 38b that blocks the ion beam 12a emitted from the first ion source 17a before the second ion source 17b. Therefore, the sample 11 can be processed while each of the first ion source 17a and the second ion source 17b is protected from the ion beam 12.

Note that in the third embodiment, first, the sample 11 is irradiated with the ion beam 12a via the first shielding member 29a by emitting the ion beam 12a from the first ion source 17a, and then the sample 11 is irradiated with the ion beam 12b via the second shielding member 29b by emitting the ion beam 12b from the second ion source 17b. However, the present invention is not limited thereto, and the processing order may be reversed. Specifically, first, the sample 11 may be irradiated with the ion beam 12b via the second shielding member 29b by emitting the ion beam 12b from the second ion source 17b, and then the sample 11 may be irradiated with the ion beam 12a via the first shielding member 29a by emitting the ion beam 12a from the first ion source 17a.

Figure 22:
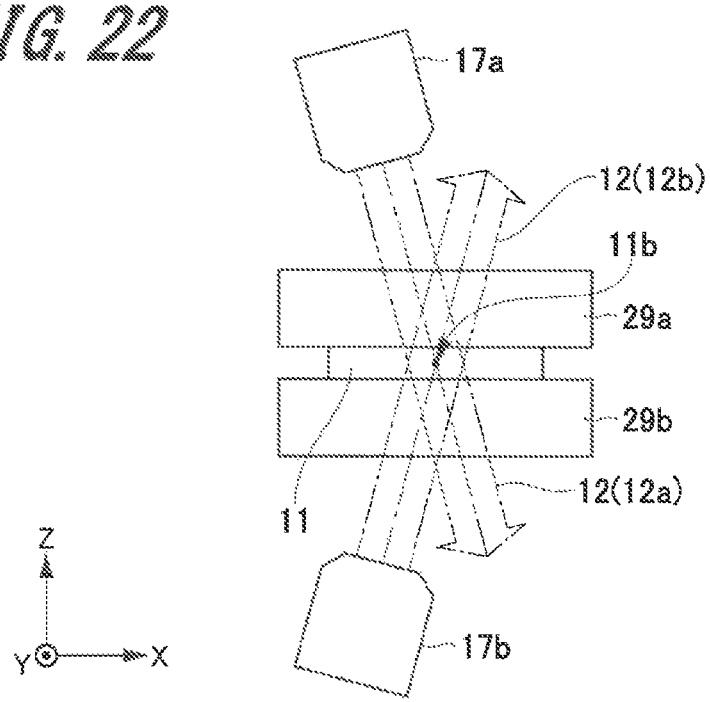
FIG. 22 illustrates a diagram for describing a modification of the ion milling apparatus according to the third embodiment of the present invention.
Figure 23:
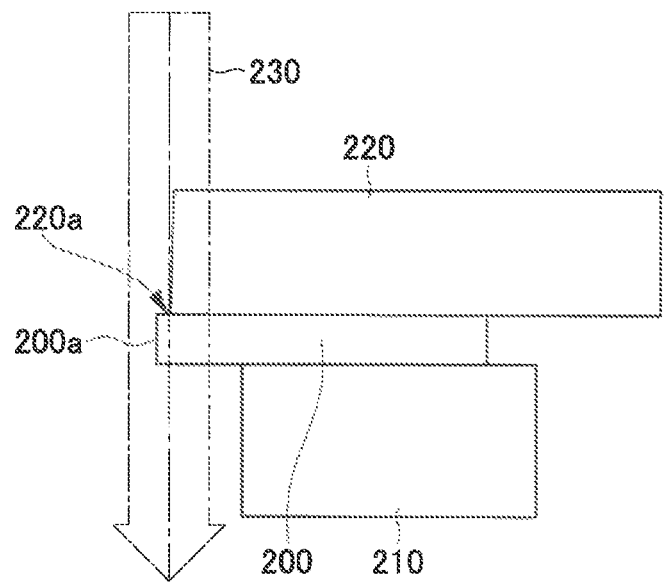
FIG. 23 is a diagram illustrating a first example of a conventional ion milling apparatus.
Figure 24:
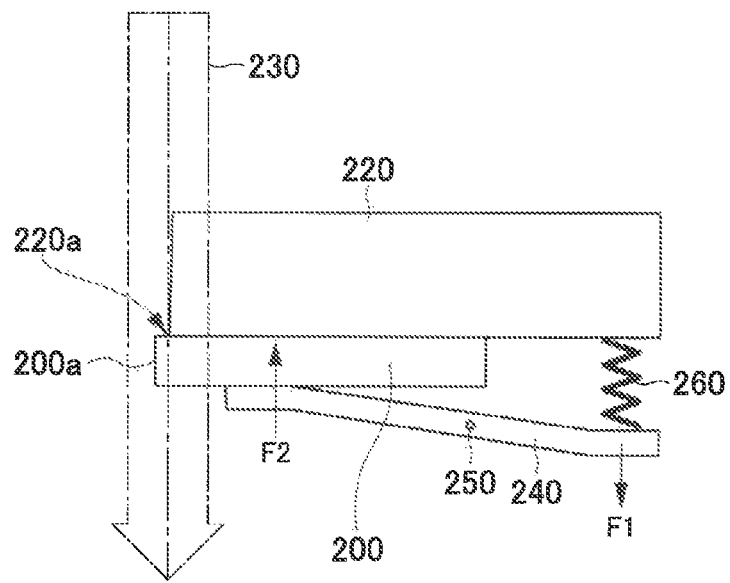
FIG. 24 is a diagram illustrating a second example of the conventional ion milling apparatus.
Figure 25:
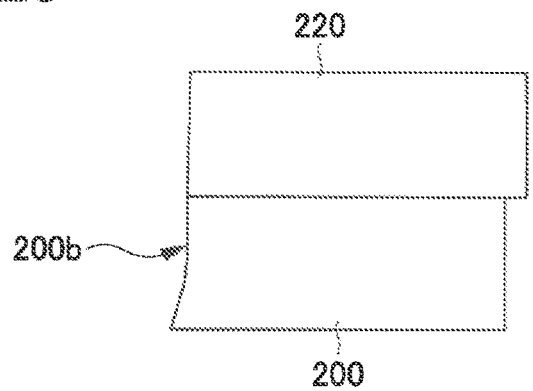
FIG. 25 is a diagram for describing a cross-sectional shape of a sample formed by the conventional ion milling apparatus.
Figure 26:
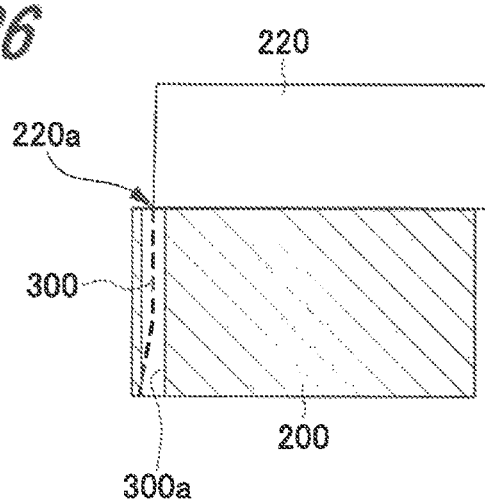
FIG. 26 is a diagram (part 1) for describing problems caused by the conventional ion milling apparatus.
Figure 27:
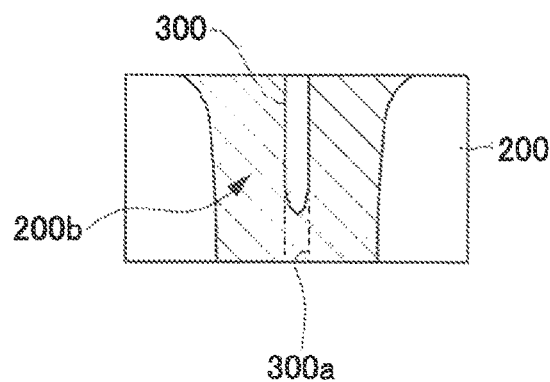
FIG. 27 is a diagram (part 2) for describing the problems caused by the conventional ion milling apparatus.

In addition, in the third embodiment, an example in which the first ion source 17a and the second ion source 17b are arranged on the same axis has been illustrated, but the present invention is not limited thereto, and the first ion source 17a and the second ion source 17b may be arranged on different axes as illustrated in FIG. 22. The first ion source 17a is arranged at a position shifted from a central axis of the ion beam 12b so that the first ion source 17a is not irradiated with the ion beam 12b emitted from the second ion source 17b. The second ion source 17b is arranged at a position shifted from a central axis of the ion beam 12a so that the second ion source 17b is not irradiated with the ion beam 12a emitted from the first ion source 17a.

In addition, the first ion source 17a emits the ion beam 12a in an obliquely downward direction having an inclination with respect to a vertical axis (Z direction), and the second ion source 17b emits the ion beam 12b in an obliquely upward direction having an inclination with respect to the vertical axis. The sample 11 is irradiated with the ion beam 12a emitted from the first ion source 17a via the first shielding member 29a, and the sample 11 is irradiated with the ion beam 12b emitted from the second ion source 17b via the second shielding member 29b. In addition, the central axis of the ion beam 12a emitted from the first ion source 17a and the central axis of the ion beam 12b emitted from the second ion source 17b intersect with each other at the processing position 11b of the sample 11.

Even in a case where the first ion source 17a and the second ion source 17b are arranged as described above, the sample 11 can be processed from both the upper and lower surfaces. Therefore, it is possible to efficiently manufacture the sample 11 having a cross section whose inclination is reduced, and it is possible to shorten processing time until a desired processed cross section is obtained. In addition, each of the first ion source 17a and the second ion source 17b can be protected from the ion beam 12 without providing the first shutter 38a and the second shutter 38b. In addition, by simultaneously emitting the ion beam 12a from the first ion source 17a and the ion beam 12b from the second ion source 17b, processing can be simultaneously performed from the upper surface side and the lower surface side of the sample 11. As a result, it is possible to further shorten the processing time.

Note that in FIG. 22, the sample 11 is obliquely irradiated with each of the ion beam 12a emitted from the first ion source 17a and the ion beam 12b emitted from the second ion source 17b, but it is also possible to vertically irradiate the sample 11 with the each of the ion beam 12a and the ion beam 12b. Specifically, in a case where the ion beam 12a is emitted from the first ion source 17a, it is possible to vertically irradiate the sample 11 with the ion beam 12a by rotating the sample 11 by a predetermined angle in a counterclockwise direction of FIG. 22 by a rotation mechanism 19 described above. In addition, in a case where the ion beam 12b is emitted from the second ion source 17b, it is possible to vertically irradiate the sample 11 with the ion beam 12b by rotating the sample 11 by a predetermined angle in a clockwise direction of FIG. 22 by the rotation mechanism 19 described above. Furthermore, in order to expand a processing range by the irradiation of the ion beam 12, the inclination operations described in the first embodiment and the second embodiment described above can be performed.

What is claimed is:

1. An ion milling apparatus comprising:
   a pair of shielding members sandwiching a sample; and
   an ion source configured to irradiate the sample with an ion beam, wherein
      the ion milling apparatus is configured to be capable of irradiating the sample with the ion beam in a first mode of irradiating the sample with the ion beam via one shielding member of the pair of shielding members and in a second mode of irradiating the sample with the ion beam via the other shielding member, and to be switchable between the first mode and the second mode; and
      the ion source is configured to irradiate the sample and the pair of shielding members with the ion beam at the same time.

2. The ion milling apparatus according to claim 1, further comprising:
   a sample holder having the pair of shielding members; and
   a sample stage to and from which the sample holder is attachable and detachable, wherein
   the ion milling apparatus is configured to be switchable between the first mode and the second mode by changing an orientation in which the sample holder is mounted on the sample stage.

3. The ion milling apparatus according to claim 1, further comprising:
   a sample holder having the pair of shielding members;
   a sample stage to and from which the sample holder is attachable and detachable; and
   a rotation mechanism configured to rotate the sample holder, wherein
   the ion milling apparatus is configured to be switchable between the first mode and the second mode by rotating the sample holder by the rotation mechanism.

4. The ion milling apparatus according to claim 3, wherein the rotation mechanism is configured to rotate the sample holder by 360°.

5. The ion milling apparatus according to claim 3, wherein the rotation mechanism is configured to rotate the sample holder about a processing position of the sample.

6. The ion milling apparatus according to claim 1, wherein the ion source includes a first ion source and a second ion source,
the first ion source is configured to irradiate the sample with an ion beam via the one shielding member, and
the second ion source is configured to irradiate the sample with an ion beam via the other shielding member.

7. The ion milling apparatus according to claim 6, wherein the first ion source and the second ion source are arranged to face each other on the same axis passing through a processing position of the sample.

8. The ion milling apparatus according to claim 6, further comprising:
a first shutter configured to block the ion beam emitted from the second ion source before the first ion source; and
a second shutter configured to block the ion beam emitted from the first ion source before the second ion source.

9. The ion milling apparatus according to claim 6, wherein the first ion source and the second ion source are arranged on different axes so that the ion beam emitted from one ion source of the first ion source and the second ion source is not emitted to the other ion source.

10. A method of manufacturing a sample comprising:
a first processing step of sandwiching a sample by a pair of shielding members and irradiating the sample with an ion beam via one shielding member; and
a second processing step of irradiating the sample with the ion beam via the other shielding member, after ending the first processing step, wherein the ion source is configured to irradiate the sample and the pair of shielding members with the ion beam at the same time.

* * * * *